United States Patent [19]

Johnson

[11] Patent Number: 4,536,270
[45] Date of Patent: Aug. 20, 1985

[54] APPARATUS AND METHOD FOR SHIELDING MAGNETIC HEADS DURING A SPUTTERING OPERATION

[75] Inventor: Robert A. Johnson, Minnetonka, Minn.

[73] Assignee: Magnetic Peripherals, Minneapolis, Minn.

[21] Appl. No.: 555,851

[22] Filed: Nov. 28, 1983

[51] Int. Cl.³ .................................................. C23C 15/00
[52] U.S. Cl. ................................. 204/192 R; 118/504; 118/720; 204/298
[58] Field of Search ............ 204/29 B, 192 R, 192 C, 204/192 M, 192 D; 118/504, 505, 720, 721, 728; 427/282; 29/603

[56] References Cited

U.S. PATENT DOCUMENTS

| | | | |
|---|---|---|---|
| 3,458,926 | 8/1969 | Maissel et al. | 29/603 |
| 3,678,892 | 7/1972 | Fairchild | 118/504 |
| 4,170,032 | 10/1979 | Yokoyama et al. | 360/120 |
| 4,249,301 | 2/1981 | Cartwright | 29/603 |
| 4,298,899 | 11/1981 | Argumedo et al. | 360/122 |
| 4,322,277 | 3/1982 | Opresko | 204/192 R |
| 4,451,344 | 5/1984 | Burkhart et al. | 204/192 R |

OTHER PUBLICATIONS

IBM Tech. Discl. Bull., vol. 20, No. 8, p. 3233, Jan. 1979, Magnetic Head with Sputtered Ceramic Gap.

Primary Examiner—Andrew H. Metz
Assistant Examiner—William T. Leader
Attorney, Agent, or Firm—Edward L. Schwarz; Joseph A. Genovese

[57] ABSTRACT

In the process for manufacturing the ferrite cores used in magnetic data transducer heads, a novel stacking of the bars from which the core pieces are cut allows these bars to mutually shield each other's back gap areas during the alumina sputtering step which sets the lengths of the read/write flux gaps. An inexpensive fixture supports the bars in the desired position during the sputtering operation.

6 Claims, 3 Drawing Figures

APPARATUS AND METHOD FOR SHIELDING MAGNETIC HEADS DURING A SPUTTERING OPERATION

BACKGROUND OF THE INVENTION

In many of the magnetic disk memories now in use, the read/write transducer employs a ferrite core for the magnetic flux path. As is well known, such a core includes a short read/write flux gap at which point the flux in the core flows through the medium. The structure of these cores typically comprises a so-called "C" core piece and an "I" core piece which are bonded together with a thin layer of non-magnetic material in the read/write gap area to provide the spacing needed to form the gap. Tyically, read/write gap length is held to a few tens of microinches. Such a small length permits close packing of the individual bits linearly along each data track on the disk.

Individual cores are formed by a process which starts with the formation of a relatively long C core piece bar (C bar) and a relatively long I core piece bar (I bar). The cross section of each is uniform and identical to that of an individual C core piece or I core piece respectively. The two bars are bonded together in the configuration forming a cross section identical to that desired for a complete core using a thin layer of solder glass sputtered on the gap faces. The two bars are pressed together and heated to melt the solder glass and create the bond. After machining the transducing face to set gap height, the composite bar is then sliced transversely into the individual cores.

To allow interchangeability of written disks among individual transducing heads, it is important to control read/write gap length during the manufacturing process, so that each head has a gap length within a preselected tolerance. In one manufacturing method, this is accomplished by sputtering a preselected thickness of alumina on the bar faces defining the gap before sputtering on the solder glass. When the two pieces are then bonded together, only the small amount of glass bonding material remains between them, and the thickness of the alumina layer(s) and the glass bonding material form the entire gap length. Typically, the glass bonding layer is very thin relative to the length of the alumina layer, so that accurate control of the alumina layer thickness accurately defines gap length.

In the described core construction, where the I core piece is bonded to the two ends of the C core piece, in effect two flux gaps are created. The desire to reduce the reluctance within individual cores throughout the flux path except at the read/write flux gap, makes it desirable to keep the length of the gap not used for reading and writing, the so-called back gap, as short as possible. In effect, it should have merely the length of the bonding glass layer thickness. Therefore, during the alumina sputtering operation, it is necessary to shield the back gap face areas in some way to prevent alumina from attaching itself in those areas and undesirably increasing the reluctance of the magnetic path through the cores ultimately created.

This shielding has in the past been accomplished in one process through the use of mechanical shields simply placed on the back gap areas of the I and C core pieces during the sputtering step. When dealing with large numbers of these magnetic bars in a single sputtering operation as is usually the case, this requires a large number of these shields, all of which must be individually placed to shield the bars. Apart from the fact that this is time consuming and hence expensive, it is also possible that these shields will be accidently moved when the tray carrying the cores is placed in the sputtering oven, which if not corrected results in unusable parts. Another approach employs deposited masks to shield these areas. While reliable, this requires additional steps of first depositing and then removing the masks, and hence adds cost to the overall process. Accordingly, there is substantial motivation for finding a simple, effective, inexpensive means for providing this shielding.

BRIEF DESCRIPTION OF THE INVENTION

As an alternative to the use of shields or masks, it is possible to use individual C bars or I bars as masks for other C bars or I bars during the sputtering. By supporting the parts at an appropriate angle from the horizontal, individual parts can be made to lie in overlapping fashion on those immediately adjacent them, with the back gap areas to be shielded from the sputtering electrode directly below one neighboring bar. To assure alignment wth the necessary accuracy between neighboring bars, it is usually necessary to provide a grooved or stepped support or fixture, so that each bar will have a preferred position of repose on the fixture and relative its neighbors, and will not shift while being moved, exposed to vibration, etc.

Accordingly, one purpose of this invention is to simplify shielding of ferrite bars during alumina sputtering on the back gap faces.

Another purpose is to reduce the likelihood of improper shielding of such ferrite bars during sputtering.

A further purpose is to reduce the number of production steps in the core manufacturing process.

Yet another purpose is to reduce the number of parts necessary to accomplish such shielding.

DESCRIPTION OF THE PREFERRED EMBODIMENT

Figure 1:
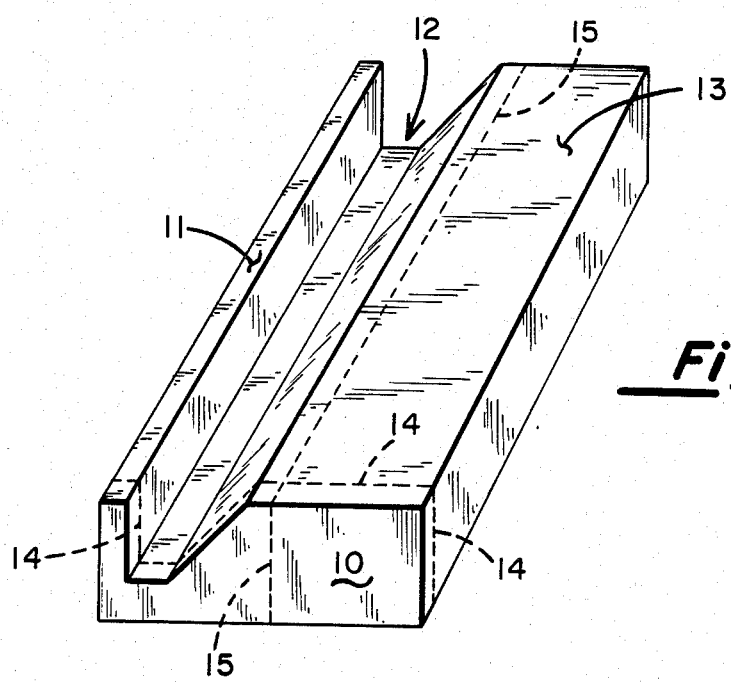
FIG. 1 is a perspective view of a typical ferrite bar which may be employed in practicing this invention.

Turning first to FIG. 1, the ferrite bar 10 therein is representative of those which provide the individual C core pieces forming a part of the ferrite cores used in data transducing heads. The ferrite bar 10 has a groove or channel 12 which defines three legs of the flux paths of the individual cores. Surface 11 forms one face of the back gap of each of the transducers formed from bar 10, and must be kept free of the alumina or other material to be deposited on surface 13 during the sputtering operation. A part of surface 13 forms the face of the read/write gap carried by the C core element of the finished transducer. The alumina layer eventually deposited on surface 13 defines at least a portion of the length of the read/write gap. An I bar, which furnishes the material for the fourth leg of the individual cores, is in size similar to bar 10 shown here, but has no groove 12. Alumina may be sputtered on either or both of each I bar and C bar.

After the alumina sputtering, an I bar is bonded to C bar 10, extending to completely cover gap face 11 and least a part of read/write gap surface 13. After an I bar has been bonded to C bar 10, then the complete assembly is sliced along a plane defined by lines 15 to approximately set the read/write gap height of the individual core elements to be formed from the assembly. Then C bar 10 and the attached I bar is cut along a plane intersecting dotted lines 14, thereby forming a single transducer core element ready to be wound and then mounted in a head pad. Additional cuts at regular intervals parallel to the plane defined by lines 14 along the length of the assembly form additional transducer cores.

One should realize that bar 10 is shown in substantially magnified scale. In a typical manufacturing process now in use, the width of back gap face 11 is at the most a few hundred microns wide. Dimensions of other features shown in FIG. 1, except for the length of bar 10, are roughly to scale. Accordingly, one can see that even the manipulations to manually place a shield to cover only back gap face 11 is a difficult matter to accomplish.

Figure 2:
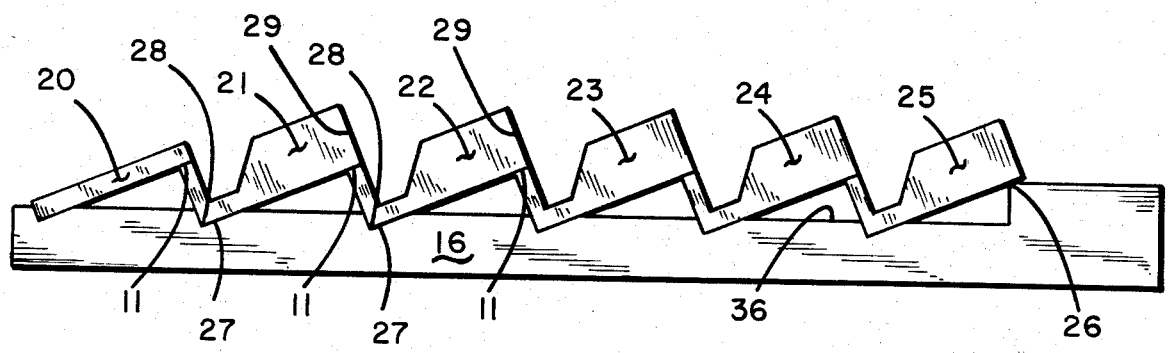
FIG. 2 is an end view of a number of the ferrite bars of FIG. 1 in the preferred position for insertion in a sputtering chamber.
Figure 3:
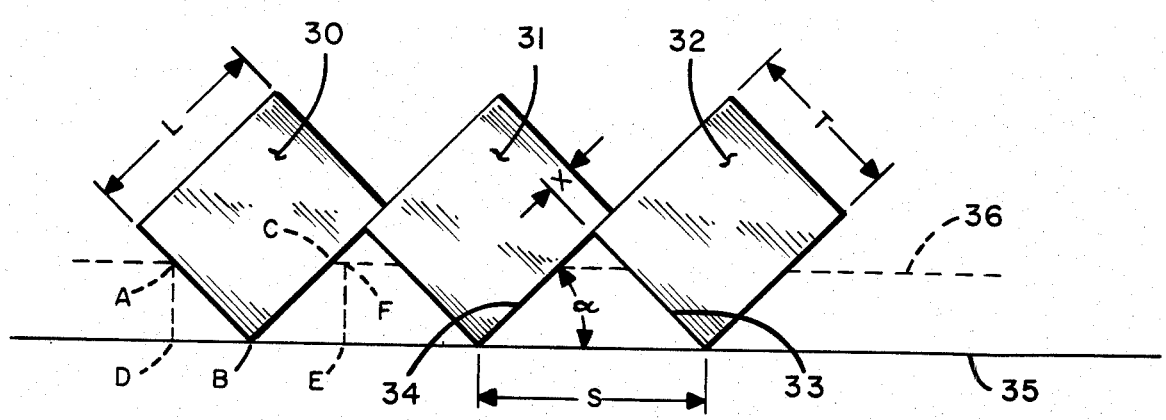
FIG. 3 is an end view of ferrite bars of a generalized shape useful for geometric analysis of the invention.

In describing FIGS. 2 and 3, assume that the cross section of a bar 10 to be sputtered is effectively rectangular. This simplifies understanding considerably, but is not essential in practicing the invention. In FIG. 2, C core bars 12-25 are shown supported by a fixture 16. Fixture 16 is formed from a generally flat plate with a corner 26 formed by a step at one edge. A series of triangular cross section parallel grooves 27 are cut parallel to each other. Ferrite bars 21-25 have first corners 28 and surfaces immediately adjacent whose shape matches the grooves 27 in such a way that when ends 29 of bars 21-25 are supported by a back gap face 11 of an adjacent bar 24 or by corner 26, the bars 21-25 have the preferred position of repose shown in FIG. 2.

As shown in FIG. 2, individual bars 21-25 are laid on fixture 16 with their corners 28 opposite the back gap face areas 11, resting in grooves 27, with ends 29 supported by back gap face areas 11 of the adjacent bars 21-25. The two end-most bars 21 and 25 must be handled differently because they obviously have only a single adjacent neighbor. With respect to bar 21, there is no neighbor avaible to shield its back gap face area 11, and hence the shielding of its face 11 is performed by a plate or dummy bar 20. Similarly, bar 25 has no bar carrying a back gap face area 11 to support its end 29. Instead this function has been performed by corner 26. However, if bars 21-25 are narrow enough to be supported in their respective grooves without resting on a neighbor, or if the grooves are deep enough to support them independently, then corner 26 may be omitted. Back gap areas of I bars may be shielded in the same way, and if the length L and thickness T (see FIG. 3) of the I bars and C bars are the same, the same fixtures 16 may be used. The I and C bars may even be intermixed if the same thickness of alumina is specified for each.

An entire fixture 16 is loaded with the bars 21-25 and plate 20 and then inserted in a sputtering chamber. The overlap of individual back gap face areas 11 by the neighboring bar's end 29 prevents the sputtering of material onto back gap face areas 11. While a fixture 16 suitable for five bars 21-25 is shown, the only effective limit on the number of bars 21-25 carried by a fixture 16 is the size of the sputtering chamber into which the assembly is to be inserted.

FIG. 3 defines the critical dimensions of an individual bar 21-25 which determine the spacing S between individual grooves 27 in fixture 16. Turning to the generalized identical bar cross sections 30-32, assume that each has a length L, thickness T, and desired amount of overlap (width of back gap face area 11) X. The angle which surfaces 34 of individual bars 30-32 must assume with respect to datum line 35 is $\alpha$. It is clear from the assumption of bar cross sections 30-32 as rectangular, that surfaces 33 and 34 must form a right angle at their intersection. Accordingly, $S=[(L-X)^2+T^2]^{\frac{1}{2}}$ and $\alpha = \arctan[T/(L-X)]$. It is usually preferable to choose X somewhat greater than the actual back gap width to minimize the amount of alumina deposited in the back gap area if the surfaces 34 do not lie perfectly flat on the back gap areas.

Thus, for the bar cross sections 30-32 shown, to achieve the overlap X desired, individual grooves should have a triangular cross section with a right angle corner in the bottom and have surface BC form an angle $\alpha$ with datum line 35. Dashed line 36 indicates a possible position for the upper surface of a fixture 16. The groove 27 depth can not exceed $(L-X)\sin\alpha$. Thus, for the depth of grooves 27 shown in FIG. 3, lines AB and BC specify the desired cross section of an individual groove 27, surfaces defined by lines AB and BC being at right angles to one another and the surface defined by line BC forming an angle $\alpha$ with datum line 35. Although the triangular shape of a groove 27 is preferred because it tends to guide a bar 21-25 more precisely into position, a rectangular groove such as is shown in FIG. 3 by ADEF is suitable, but of course point F must not lie between points A and C so as to affect the position of the bar within it.

In fact, the triangular cross section has generally in practice proved to more accurately seat the individual bars 21-25 in position, than have rectangular grooves. Furthermore, triangular grooves if deep enough (and bars 21-25 are short enough), have the advantage of providing sufficient stability for bar 25 to make corner 26 unnecessary.

This describes my invention.

What I claim is:

1. A manufacturing assembly for controlling the deposition of material in a sputtering chamber, comprising a plurality of ferrite bars of the type from which elements of ferrite transducer cores are cut, said ferrite bars each having on one side adjacent a first end and opposite a first corner partly defining the first end, a back gap face area, said back gap face area to be protected from deposition of material during a sputtering process; and a fixture having a plurality of upwardly facing parallel support grooves in each of which the first corner of a ferrite bar and the area surrounding it rests back gap face facing upward, said support grooves having a spatial arrangement supporting the ferrite bars with the ferrite bars in overlapping relationship with similar angular orientations, with each ferrite bar except one shielding and covering the back gap face of a neighbor, thereby preventing deposition of material on said shielded and covered back gap faces.

2. The assembly of claim 1 wherein the fixture includes a flat surface having a plurality of identical support grooves spaced a predetermined distance from each other.

3. The assembly of claim 2, wherein the cross sectional shape of the grooves is triangular.

4. The assembly of claim 2 wherein each of the ferrite bars have substantially rectangular cross section with a length L, thickness T, and back gap face area of width X, and wherein a pair of adjacent grooves in the fixture are spaced from each other by a distance S, where $S=[(L-X)^2+T^2]^{\frac{1}{2}}$.

5. The assembly of claim 2 wherein the fixture includes a step adjacent an outermost groove, and having a predetermined height and spacing from the adjacent groove.

6. In a method for preparing for sputtering a material on a plurality of identical ferrite bars of the type from which elements of ferrite transducer cores are cut, said ferrite bars each having on one side adjacent a first end and opposite a first corner partly defining the first end a back gap face area, the steps of:

(a) forming in a substantially flat surface of a fixture a plurality of parallel support grooves into each of which the first corner of one of the ferrite bars and the area surrounding it may be laid back gap face facing upward, said support grooves having a spatial arrangement allowing a ferrite bar first corner to be laid in each groove with the ferrite bars in overlapping relationship with each ferrite bar except one shielding and covering the back gap face of a neighbor;

(b) orienting said fixture with its grooves facing generally upwards;

(c) placing a ferrite bar in each groove in overlapping relationship with each ferrite bar except one shielding and covering the back gap face of a neighbor; and (d) placing the fixture with the ferrite bars laid on it in a sputtering chamber.

* * * * *